(12) United States Patent
Sarkar et al.

(10) Patent No.: US 11,404,267 B2
(45) Date of Patent: Aug. 2, 2022

(54) SEMICONDUCTOR STRUCTURE FORMATION

(71) Applicant: Micron Technology, Inc., Boise, ID (US)

(72) Inventors: Santanu Sarkar, Boise, ID (US); Jerome A. Imonigie, Boise, ID (US); Kent H. Zhuang, Boise, ID (US); Josiah Jebaraj Johnley Muthuraj, Meridian, ID (US); Janos Fucsko, Boise, ID (US); Benjamin E. Greenwood, Boise, ID (US); Farrell M. Good, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 394 days.

(21) Appl. No.: 16/729,903

(22) Filed: Dec. 30, 2019

(65) Prior Publication Data

US 2021/0202246 A1    Jul. 1, 2021

(51) Int. Cl.
*H01L 21/02*        (2006.01)
*H01L 21/762*       (2006.01)
*H01L 23/532*       (2006.01)

(52) U.S. Cl.
CPC .. *H01L 21/02321* (2013.01); *H01L 21/02123* (2013.01); *H01L 21/02126* (2013.01); *H01L 21/02137* (2013.01); *H01L 21/02203* (2013.01); *H01L 21/02337* (2013.01); *H01L 21/02359* (2013.01); *H01L 21/76224* (2013.01); *H01L 21/02282* (2013.01); *H01L 23/5329* (2013.01)

(58) Field of Classification Search
CPC ......... H01L 21/02321; H01L 21/02123; H01L 21/02126; H01L 21/02137; H01L 21/02203; H01L 21/02337; H01L 21/02359; H01L 21/76224; H01L 23/5329
USPC ........................................................ 257/798
See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 10,259,893 B1* | 4/2019 | McDaniel | ............ B01J 35/1019 |
| 2004/0172973 A1* | 9/2004 | Chen | ........................ C03C 11/00 |
| | | | 65/17.2 |
| 2016/0351443 A1* | 12/2016 | George | .................... B01J 23/38 |

* cited by examiner

*Primary Examiner* — David Vu
*Assistant Examiner* — Brandon C Fox
(74) *Attorney, Agent, or Firm* — Brooks, Cameron & Huebsch, PLLC

(57) ABSTRACT

Systems, apparatuses, and methods related to semiconductor structure formation are described. An example apparatus includes a structural material for a semiconductor device. The structural material includes an orthosilicate derived oligomer having a number of oxygen (O) atoms each chemically bonded to one of a corresponding number of silicon (Si) atoms and a chemical bond formed between an element from group 13 of a periodic table of elements (e.g., B, Al, Ga, In, and Tl) and the number of O atoms of the orthosilicate derived oligomer. The chemical bond cross-links chains of the orthosilicate derived oligomer to increase mechanical strength of the structural material, relative to the structural material formed without the chemical bond to crosslink the chains, among other benefits described herein.

29 Claims, 6 Drawing Sheets

550 ─▶

┌─────────────────────────────────────────────────────────────┐
│ EXPOSING A STRUCTURAL MATERIAL FOR A SEMICONDUCTOR DEVICE   │
│ TO AN ELEMENT FROM GROUP 13 OF A PERIODIC TABLE OF ELEMENTS,│──551
│ WHERE THE STRUCTURAL MATERIAL COMPRISES                     │
│ AN ORTHOSILICATE DERIVED OLIGOMER HAVING                    │
│ A NUMBER OF OXYGEN (O) ATOMS EACH CHEMICALLY BONDED         │
│ TO ONE OF A CORRESPONDING NUMBER OF SILICON (SI) ATOMS      │
└─────────────────────────────────────────────────────────────┘

┌─────────────────────────────────────────────────────────────┐
│ FORMING A CHEMICAL BOND BETWEEN THE ELEMENT AND             │
│ THE NUMBER OF O ATOMS OF THE ORTHOSILICATE DERIVED OLIGOMER │──552
│ AS A RESULT OF MOVEMENT OF THE ELEMENT THROUGH              │
│ A SURFACE OF THE STRUCTURAL MATERIAL                        │
└─────────────────────────────────────────────────────────────┘

┌─────────────────────────────────────────────────────────────┐
│ CROSSLINKING CHAINS OF THE ORTHOSILICATE DERIVED OLIGOMER   │──553
│ TO A DEPTH OF THE MOVEMENT BELOW THE SURFACE                │
└─────────────────────────────────────────────────────────────┘

┌─────────────────────────────────────────────────────────────┐
│ INCREASING MECHANICAL STRENGTH OF THE STRUCTURAL MATERIAL   │
│ TO THE DEPTH OF THE CROSSLINKING RELATIVE TO                │──555
│ THE STRUCTURAL MATERIAL FORMED WITHOUT THE CROSSLINKING     │
└─────────────────────────────────────────────────────────────┘

*Fig. 5*

SEMICONDUCTOR STRUCTURE FORMATION

TECHNICAL FIELD

The present disclosure relates generally to semiconductor devices and methods, and more particularly to semiconductor structure formation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory (e.g., NAND, NOR, etc.), among others. Some types of memory devices may be non-volatile memory. For instance, ReRAM, NAND, and three-dimensional cross-point ("3D cross-point") non-volatile memories may be used for a wide range of electronic applications in need of high memory densities, high reliability, and low power consumption. Volatile memory cells (e.g., DRAM cells) require power to retain their stored data state (e.g., via a refresh process to compensate for loss of charge), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells. Functionality, support, and/or isolation of the memory, among other components of semiconductor devices, may be provided by various structural materials.

BRIEF DESCRIPTION OF THE DRAWINGS

FIG. 5 is a flow diagram of an example method for fabricating a semiconductor structure in accordance with a number of embodiments of the present disclosure.

DETAILED DESCRIPTION

Figure 1:
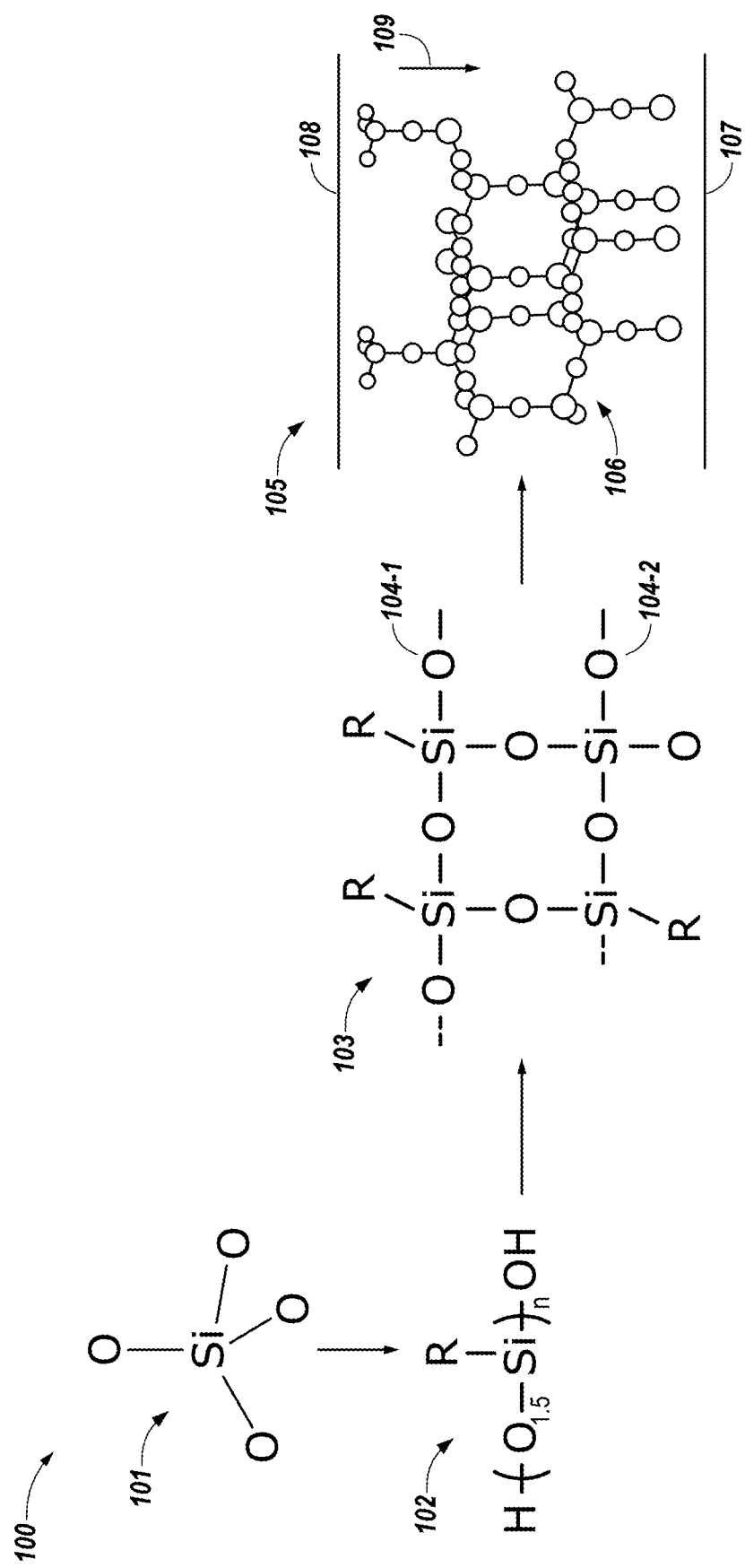
FIG. 1 illustrates particular points in an example semiconductor fabrication sequence for formation of a structural material using chains of an orthosilicate derived oligomer in accordance with a number of embodiments of the present disclosure.

The present disclosure includes systems, apparatuses, and methods related to semiconductor structure formation. An example apparatus includes a structural material for a semiconductor device. The structural material includes an orthosilicate derived oligomer having a number of oxygen (O) atoms each chemically bonded to one of a corresponding number of silicon (Si) atoms and a chemical bond formed between an element from group 13 of a periodic table of elements and the number of O atoms of the orthosilicate derived oligomer. The chemical bond crosslinks chains of the orthosilicate derived oligomer to increase mechanical strength of the structural material, relative to the structural material formed without the chemical bond to crosslink the chains, among other benefits described herein.

The orthosilicate derived oligomer described herein may, in a number of example embodiments, be a spin on dielectric (SOD) material and/or spin on glass (SOG) material for use in a trench isolation region between conductive materials of the semiconductor device and/or may be a pre-metal dielectric (PMD) material for use in association with a Si containing substrate to isolate the Si containing substrate from a metal contaminant during processing, among other possible uses. Such SOD materials, SOG materials, and/or PMD materials may be treated after application to the intended semiconductor structure to compensate for (e.g., overcome) potential conditions (e.g., problems) of such materials. Examples of such conditions may be low mechanical strength (e.g., as determined by a low Young's modulus value) and/or low adhesion to maintain integrity of a surface thereof (e.g., to reduce likelihood of pore formation and/or unintended removal of such materials during processing). Such conditions may result from the materials being formed with oligomers and/or polymers originally being oriented randomly relative to each other and/or unbound to each other (e.g., being formed amorphously).

Examples of previous approaches intended to overcome such potential conditions (e.g., by increasing the mechanical strength of the materials) include the previously formed materials being treated with thermal, photochemical, and plasma techniques. Examples of thermal techniques may include furnace densification and/or annealing. However, such thermal techniques may involve raising a temperature of the semiconductor device (e.g., including the associated structural material) beyond a thermal tolerance such that the functionality of the semiconductor device may be compromised (e.g., reduced) and/or performance of the thermal techniques may last between several hours and a day.

An example of a photochemical technique is an ultraviolet (UV) light cure that may be performed on an organosilicate material (e.g., a layer or film formed from such material). As described herein, an organosilicate material is intended to mean an orthosilicate derived oligomer in which an Si atom may be covalently bonded to one or more hydrocarbon and/or oxyhydrocarbon organic side groups. However, the UV photons used in performance of such a UV cure may break bonds between Si atoms and carbon (C) atoms and/or may break bonds between O atoms and hydrogen (H) atoms (e.g., in a hydroxyl (—OH) group). One unintended result of such an UV cure may be breaking Si—C bonds of the organic side groups to release organic by-products that may be trapped in pores of, for example, the SOD materials and/or may contribute to unintended issues in downstream processing. Moreover, the UV cure does not promote sufficient crosslinking of the chains of the orthosilicate derived oligomer to increase mechanical strength of the structural material as described herein.

An example of a plasma technique is plasma densification in which either helium, nitrogen, or oxygen plasmas may be used. However, such plasma densification techniques are not applicable to increasing the mechanical strength of the structural material as described herein because they do not selectively promote crosslinking of the chains of the organosilicate material. Moreover, exposure of organosilicate material to such plasmas may break Si—C, C—C, and/or C—H bonds (e.g., to volatilize C as gaseous CO and/or $CO_2$) to degrade molecular structure of the organosilicate material and/or an intended function of the structural material.

In contrast to the previous approaches, the present disclosure describes treatment with an element from group 13 of the periodic table of elements in a gaseous state, which may, in a number of embodiments, be performed in near ambient conditions to provide high throughput, low cost processing relative to the previous approaches. The elements from group 13 referred to herein are intended to include at least one of boron (B), aluminum (Al), gallium (Ga), indium (In), and thallium (Tl). The group 13 element being in the gaseous state is intended to include molecules (e.g., hydrides) including the group 13 element, such as B in $BH_3$ or in the $B_2H_6$ dimer of $BH_3$, Al in $AlH_3$, Ga in $GH_3$, In in $InH_3$, and Tl in $TlH_3$. The element from group 13 also may, in a number of embodiments, include their coordinated complexes (e.g., $XH_3 \rightarrow MH_3$ where X=nitrogen (N), phosphorus (P), etc., and M=In, Tl, etc.) and/or may include hydrazine (e.g., $N_2H_4$) ligands. Being performed in near ambient conditions is intended to mean treatment techniques that may be performed at around 40 degrees Celsius (° C.) under high nitrogen conditions (e.g., 80-100% $N_2$ gas in a chamber 662 of a processing apparatus 661 illustrated and described in connection with FIG. 6). Movement (e.g., diffusion) of an element from group 13 in the gaseous state (e.g., as an ordinary gas or as a plasma) into the SOD structural materials (which for convenience is subsequently intended to include SOG materials) and/or the PMD structural materials may provide a number of benefits relative to the previous approaches.

For example, as described herein, treatment with a gaseous element from group 13 may enable (e.g., cause) a chemical bond to be formed between an atom of the element and a number (e.g., two) of O atoms of the orthosilicate derived oligomer to crosslink chains (e.g., two chains) of the orthosilicate derived oligomer to increase mechanical strength of the structural material relative to the structural material formed without the chemical bond to crosslink the chains. The increased mechanical strength may increase a hardness of an exposed surface of the structural material such that the exposed surface has an increased resistance and/or a reduced susceptibility to unintended removal of the material from the exposed surface as a result of processing (e.g., by chemical mechanical polishing (CMP)), among other possibilities) on or above the surface. The increased hardness of the structural material and/or the reduced removal of the structural material from the exposed surface may reduce a potential for defectivity formation in (e.g., on and through) the exposed surface. For example, the increased hardness may increase surface adhesion to maintain integrity of the surface during the processing to reduce unintended removal of the material that may contribute to scratching of the surface and/or initiation or worsening of porosity on and through the surface as potential defectivities. The reduced removal of the structural material from the exposed surface may reduce a potential for unintended scratching of a surface due to slurry residue (e.g., deposition of the removed material may cause the scratching and/or may become embedded particles on the surface as potential defectivities).

In a number of embodiments, the chemical bonds that crosslink chains of the SOD and/or PMD materials may be used as a treatment to reduce porosity on and through the exposed surface by three-dimensionally (3D) crosslinking the chains to reduce a diameter and/or a depth of (e.g., to substantially plug) a pore in the structural material. Further benefits of movement of the element through the surface of the structural material may include, but are not limited to, scavenging water ($H_2O$) molecules and/or halide contaminants during the processing in order to reduce a probability of unintended effects on the semiconductor device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. In some instances, a plurality of similar, but functionally and/or structurally distinguishable, elements or components in the same figure or in different figures may be referenced sequentially with the same element number (e.g., 212-1 and 212-2 in FIG. 2).

FIG. 1 illustrates particular points in an example semiconductor fabrication sequence 100 for formation of a structural material 105 using chains of an orthosilicate derived oligomer in accordance with a number of embodiments of the present disclosure.

FIG. 1 illustrates an orthosilicate monomer 101 that may, in a number of embodiments, be used in the formation of the structural material 105. The orthosilicate monomer 101 may be used as an anion, or group, that has a tetrahedral shape, with one Si atom surrounded by four O atoms. The orthosilicate monomer 101 may be used as an inorganic compound where one or more of the O atoms may be linked to or substituted by (e.g., ionically and/or covalently bound) atoms, or groups of atoms, that do not include C. One or more of the O atoms may linked to, or substituted by, a C atom containing group (e.g., alkyl, aryl, and/or alkoxy groups) in organic compounds. An example of such an organic alkyl compound is tetramethyl silane ($Si(CH_3)_4$) and an example of such an organic alkoxide compound is tetraethyl oxysilane ($Si(OC_2H_5)_4$, otherwise known as (TEOS)), although embodiments are not limited to these examples. In some organic orthosilicate compounds (e.g., TEOS, among others), each O atom linked to the Si atom may be formally neutral and may be coupled to a central Si atom by a single covalent bond and/or to peripheral O, C, H, and/or metal atoms by another single covalent bond. Coupled groups of atoms including the peripheral O, C, H, and/or metal atoms are represented by indicator "R" in portions of the fabrication sequence 100 shown at 102 and 103.

As next shown in the fabrication sequence 100, the orthosilicate monomer 101 may be included in a chain 102 of orthosilicate monomers. An example of such a chain 102 is represented, by way of example, by a plurality (n) of Si atoms coupled to and/or sharing a bond with at least one O atom. Each Si atom of the chain 102 may, in a number of embodiments, be coupled to an R group. One end of the chain 102 may have the corresponding Si atom coupled to an H atom and the other end of the chain 102 may have the corresponding Si atom coupled to a hydroxyl —OH group, among other possible embodiments.

As next shown in the fabrication sequence 100, a plurality of chains (e.g., two of chains 102, as shown by way of example) may be coupled to form an orthosilicate derived oligomer 103. Such an orthosilicate derived oligomer 103 may be formed by exposure of the chains 102 to appropriate conditions (e.g., particular temperatures, pressures, gases, acids, and/or bases, etc., in chamber 662 of the processing apparatus 661). In a number of embodiments, the chains 102 (collectively or individually referred to as chain 102) of the orthosilicate derived oligomer 103 may include coupled groups R that make each chain inorganic or organic or make some of the chains inorganic and some organic. As shown in FIG. 1, a number of coupled groups R and positioning thereof may differ in each chain, along with the atomic composition of different coupled groups R. A formulaic representation of the orthosilicate derived oligomer 103 may have a number of O atoms 104 each chemically bonded to one of a corresponding number of Si atoms at least one end of at least one chain 102 of the orthosilicate derived oligomer 103. The O atoms 104 may be used to couple (e.g., covalently bond) a plurality of orthosilicate derived oligomers 103 (e.g., as shown and described in connection with FIG. 2).

For ease and clarity of illustration, the orthosilicate derived oligomer 103 shown in FIG. 1 includes a first O atom 104-1 coupled to a corresponding Si atom at an end of a first chain and a second O atom 104-2 coupled to a corresponding Si atom at an end of a second chain. However, in a number of embodiments, orthosilicate derived oligomers 103 each may have any number of O atoms coupled to a corresponding Si atom at either end, or both ends, of at least one chain available for bonding (e.g., crosslinking as shown and described in connection with FIG. 2) within the same orthosilicate derived oligomer 103 and/or between any number of different orthosilicate derived oligomers 103. The O atoms 104-1, 104-2 available for crosslinking the orthosilicate derived oligomers 103 may correspond to the hydroxyl —OH groups 212-1, 212-2 illustrated in FIG. 2.

As next shown in the fabrication sequence 100, a plurality of separate orthosilicate derived oligomers 106 (e.g., as illustrated in what is intended to be a 3D representation rather than the formulaic representation) may be used to initiate formation of a structural material 105 for a semiconductor device. As described herein, the plurality of orthosilicate derived oligomers 106 of the structural material 105 may be, or may include, one or more silanes, silanols, and/or other orthosilicate derived oligomers in a number of embodiments. The structural material 105 formed from the orthosilicate derived oligomers 106 may be used as a SOD material for use in a trench isolation region between conductive materials of the semiconductor device and/or may be a PMD material for use in association with a Si containing substrate to isolate the substrate from metal contaminant during processing (e.g., CMP), among other possible uses.

The structural material 105 formed from the orthosilicate derived oligomers 106 may have a lower surface 107 that may be formed over (e.g., on) a substrate material (not shown). The structural material 105 also may have an upper surface 108 that may be exposed to enable movement of atoms of an element through the surface 108 and into the structural material 105. As shown and described in connection with FIG. 2 and elsewhere herein, the atoms of the element may be used to crosslink orthosilicate derived oligomer chains of the structural material 105 to a depth 109 (e.g., a tunably selected depth) of the movement below the upper surface 108.

Figure 2:
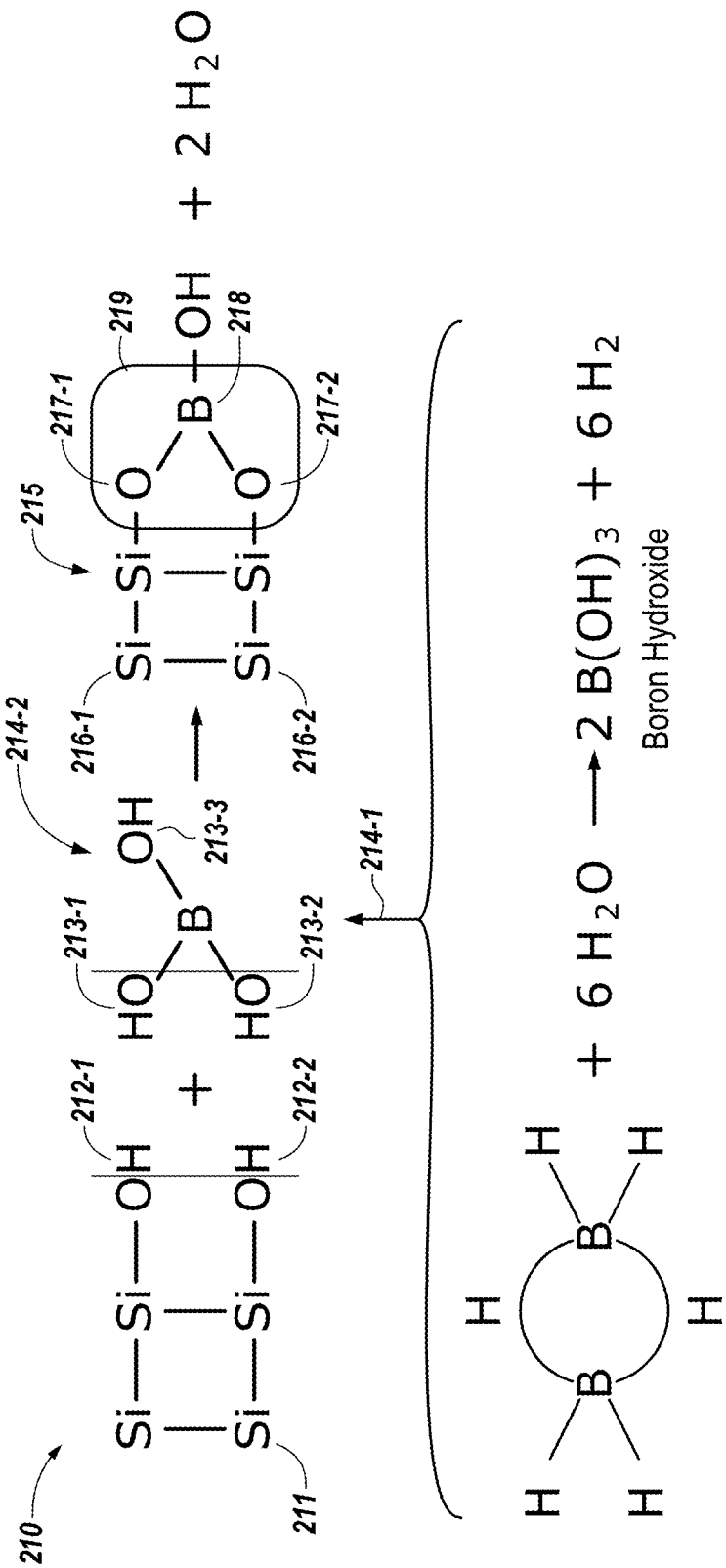
FIG. 2 illustrates particular points in an example semiconductor fabrication sequence for formation of a chemical bond to crosslink chains of the orthosilicate derived oligomer in the structural material in accordance with a number of embodiments of the present disclosure.

FIG. 2 illustrates particular points in an example semiconductor fabrication sequence 210 for formation of a chemical bond to crosslink chains of an orthosilicate derived oligomer in the structural material 105 in accordance with a number of embodiments of the present disclosure. FIG. 2 shows two chains of an example orthosilicate derived oligomer 211, which is simplified from the formulaic representation of the orthosilicate derived oligomer 103 shown and described in connection with FIG. 1. Each of the two chains may have an O atom (e.g., as shown at 104-1 and 104-2 in FIG. 1) at an end of the chain.

FIG. 2 illustrates that, in a number of embodiments, O atom 104-1 may be coupled to an H atom to form a hydroxyl —OH group 212-1 at an end of a first chain and that O atom 104-2 may be coupled to an H atom to form another hydroxyl —OH group 212-2 at an end of a second chain. As described herein, atoms of an element from group 13 of the periodic table (e.g., a compound including the atoms of that element) may be moved through an exposed surface of, and into, the orthosilicate derived oligomer 211 to enable chemical crosslinking of, for example, the two chains of the orthosilicate derived oligomer 211. Although FIG. 2 shows crosslinking of two chains of the same orthosilicate derived oligomer 211 for clarity, embodiments are not intended to be so limited in that any number of chains in the same orthosilicate derived oligomer and/or different orthosilicate derived oligomers may be crosslinked as described herein. Movement (e.g., diffusion) of the atoms of the element through the exposed surface of, and into, structural material 105 including the orthosilicate derived oligomer 211 may be performed and/or controlled in the chamber 662 of the processing apparatus 661 shown and described in connection with FIG. 6.

Selection of a compound including atoms of an element from group 13 may be based on an ability of the particular compound and/or atoms to chemically react with the hydroxyl groups 212 (collectively or individually referred to as hydroxyl group 212) to crosslink chains of the orthosilicate derived oligomer 211. Under suitable conditions (e.g., near ambient conditions, as described herein), a hydroxyl group of a compound including a number of atoms of the selected element may chemically react with a hydroxyl group 212 at an end of a chain of the orthosilicate derived oligomer 211 to chemically couple (e.g., by giving up an $H_2O$ molecule to form a covalent bond) the compound and the orthosilicate derived oligomer 211. When the compound is a hydroxide that has two or more such hydroxyl groups, a corresponding number of covalent bonds may be formed to crosslink chains of one or more of the orthosilicate derived oligomers 211. An ability (e.g., rate) of a compound, relative to other potential compounds, to diffuse into and/or through the orthosilicate derived oligomers 211 of the structural material 105 also may be considered in the selection.

The elements in group 13 may be referred to as the "boron group" because boron (B) is the element at the top of the column in the periodic table. The rest of the boron group includes aluminum (Al), gallium (Ga), indium (In), and thallium (Tl). The boron group also includes nihonium (Nh), which is an unstable radioactive element. The elements in the boron group share a trait of having three valence electrons.

For clarity, the fabrication sequence 210 in FIG. 2 is shown to use B as the element selected from the boron group, although any one or a combination of two or more of the elements in group 13 may be used in hydroxide compounds to crosslink chains of one or more of the orthosilicate derived oligomers 211. As such, boron hydroxide 214-2 is shown in FIG. 2 as the compound to be used in a chemical reaction with the orthosilicate derived oligomer 211. The boron hydroxide 214-2 is shown as a compound $B(OH)_3$ that includes three hydroxyl groups bound to B, which matches the three valence electrons of B.

As illustrated, a hydroxyl group 212-1 at an end of a first chain of the orthosilicate derived oligomer 211 may react with a first hydroxyl group 213-1 of the boron hydroxide 214-2 and a second hydroxyl group 212-2 at an end of a second chain may react with a second hydroxyl group 213-2 of the boron hydroxide 214-2 to crosslink the chains. A third hydroxyl group 213-3 of the boron hydroxide 214-2 may, in a number of embodiments, be usable to crosslink an end of a chain of another orthosilicate derived oligomer (not shown) to the orthosilicate derived oligomer 211 (e.g., in order to increase mechanical strengthen of a structural material 105 formed from a plurality of the orthosilicate derived oligomers). Each of the hydroxyl groups 213-1, 213-2, and 213-3 may, in a number of embodiments, form a chemical bond with and crosslink three different orthosilicate derived oligomers 211.

Boron hydroxide 214-2 is an intermediate reaction product that may be formed by reaction of boron hydride ($BH_3$) or diborane ($B_2H_6$) gas with $H_2O$. The diborane may, in a number of embodiments, be stored (e.g., under pressure in $N_2$ and/or $H_2$ gases) in association with the processing apparatus 661 for use in the chamber 662. The gaseous diborane may be stored at a particular concentration (e.g., in a range of from around 1% to 10%) relative to the $N_2$ and/or $H_2$ gases. The fabrication sequence 210 may include preparation 214-1 of the boron hydroxide 214-2 from a precursor compound. The precursor compound may, in a number of embodiments, be the diborane ($B_2H_6$) having two B atoms in a ring structure containing four terminal and two bridging H atoms. Similar ring structures may be formed using Al in dialane ($Al_2H_6$), Ga in digallane ($Ga_2H_6$), In in diindigane ($In2H_6$), and Tl in dithallane ($Tl_2H_6$), which may be used as precursor compounds in formation of corresponding trihydrides. The fabrication sequence 210 may include a reaction of the $B_2H_6$ with $H_2O$ to result in preparation 214-1 of two molecules of the $B(OH)_3$ hydroxide compound, in addition to six molecules of $H_2$ gas, that may provide the boron hydroxide 214-2 used for crosslinking the chains of the orthosilicate derived oligomer 211.

The fabrication sequence 210 shows that a reaction between the boron hydroxide 214-2 and the orthosilicate derived oligomer 211 may produce a crosslinked orthosilicate derived oligomer 215, along with two $H_2O$ molecules. The crosslinked orthosilicate derived oligomer 215 may have a first chain 216-1 ending in an O atom 217-1 and a second chain 216-2 ending in an O atom 217-2. Both of the O atoms 217-1, 217-2 are shown to be chemically bonded (e.g., by a covalent bond) to the B atom 218 contributed by the boron hydroxide 214-2 to crosslink 219 the chains 216 (collectively or individually referred to as chain 216). The O atoms 217-1, 217-2 at the ends of the respective chains 216-1, 216-2 may correspond to the O atoms 104-1, 104-2 shown and described in connection with FIG. 1 (collectively or individually referred to as O atom 104). Alternatively, the O atoms 217-1, 217-2 may be contributed by the hydroxyl groups 213-1, 213-2 of the boron hydroxide 214-2 or some of the O atoms 217-1, 217-2 (collectively or individually referred to as O atom 217) may originate from the orthosilicate derived oligomer 211 and some may originate from the boron hydroxide 214-2.

For clarity, the crosslinked orthosilicate derived oligomer 215 is shown to be produced from a single orthosilicate derived oligomer 211. However, a plurality of orthosilicate derived oligomers may, in a number of embodiments, be crosslinked to form a larger crosslinked orthosilicate derived oligomer 215 (e.g., using the third hydroxyl group 213-3 of the boron hydroxide 214-2). Such a crosslinked orthosilicate derived oligomer 215 may be usable as the structural material 105 described herein.

Accordingly, as shown and described in connection with FIGS. 1 and 2, a structural material 105 for a semiconductor device may, in a number of embodiments, include an orthosilicate derived oligomer 103 having a number of O atoms 104 each chemically bonded to one (e.g., only one) of a corresponding number of Si atoms. A chemical bond may be formed between an element 218 from group 13 of the periodic table and the number of O atoms 104 of the orthosilicate derived oligomer 103, 211. The chemical bond may crosslink 219 chains 216 of the crosslinked orthosilicate derived oligomer 215 to increase mechanical strength of the structural material 105 relative to the structural material formed without the chemical bond to crosslink the chains, among other benefits described herein.

A number of claims 102 of the orthosilicate derived oligomer 103 may, in a number of embodiments, be an inorganic oligomer having the Si atoms bonded to atoms of H and/or a metal (as represented by the R groups shown and described in connection with FIG. 1) in addition to the O atoms 104. Alternatively or in addition, a number of chains 102 of the orthosilicate derived oligomer 103 may be an organic oligomer having the Si atoms bonded to atoms of C (as also represented by the R groups) in addition to the O atoms 104. The organic oligomer may, in a number of embodiments, be a silsesquioxane based oligomer having the Si atoms bonded to alkyl ($C_nH_{2n+1}$), aryl (an aromatic hydrocarbon), and/or alkoxy (an aryl singularly bonded to O) groups in addition to the O atoms 104.

The element from group 13 may be a single atom of the element. The chemical bond formed between the element 218 and the number of the plurality of O atoms 217 may be a covalent bond formed by substitution of the element for a H atom from a hydroxyl group of each of two chains 216 of the crosslinked orthosilicate derived oligomer 215. The element 218 may, in a number of embodiments, be B derived from a B hydroxide ($B(OH)_3$) 214-2 that chemically crosslinks 219 a hydroxyl group 212 of each of two chains 216 of the orthosilicate derived oligomer 211 to produce the crosslinked orthosilicate derived oligomer 215. Alternatively or in addition, the element 218 may be selected from at least one of Al, Ga, In, and/or Tl derived from a respective hydroxide that chemically crosslinks 219 a hydroxyl group 212 of each of two chains 216 of the crosslinked orthosilicate derived oligomer 215. The group 13 element 218 may be provided by corresponding hydrides and/or derivatives that include that element. The group 13 element 218 may, in a number of embodiments, be included in trihydrides, such as B in $BH_3$ or in the $B_2H_6$ dimer of $BH_3$, Al in $AlH_3$, Ga in $GH_3$, In in $InH_3$, and Tl in $TlH_3$. The element from group 13 also may, in a number of embodiments, included in their coordinated complexes (e.g., $XH_3 \rightarrow MH_3$ where X=N, P, etc., and M=In, Tl, etc.) and/or in appropriate molecules that include hydrazine ligands. The chemical bond crosslink 219 formed as such may increase the mechanical strength of the structural material 105 from a range of from around 4 gigapascals (GPa) to around 9 GPa, based on a Young's modulus, to a range of from around 20 to around 60 GPa such that the mechanical strength is increased at least five-fold.

The orthosilicate derived oligomer 103 (e.g., prior to crosslinking chains thereof) may, in a number of embodiments, be a SOD material for use in formation of a structural material 105 in a trench isolation region between conductive materials of the semiconductor device and/or for use in a trench between memory arrays (e.g., as shown at 777 and described in connection with FIG. 7). In inorganic and/or organic embodiments, the orthosilicate derived oligomer 103 may be used to form a SOD material that has a low dielectric constant (k) value relative to k=3.9 for silicon dioxide ($SiO_2$). In organic embodiments, the orthosilicate derived oligomer 103 may be formed using a silsesquioxane based oligomer for use as the SOD material. An organic SOD material formed from silsesquioxane based oligomers may have a k value lower (less) than 3.9 (e.g., depending upon composition of a number of R groups. Alternatively, an organic SOD material formed from silsesquioxane based oligomers may have a k value greater than 3.9 (e.g., depending upon composition of a number of R groups).

The crosslinked orthosilicate derived oligomer 215 may, in a number of embodiments, be a PMD material for use in formation of a structural material 105 in association with a Si containing substrate. The chemical bond may crosslink 219 chains 216 of the PMD material to reduce porosity of a surface 108 of the PMD material. The reduced porosity may enhance formation of a PMD material as a structural barrier that isolates the Si containing substrate from a metal contaminant during processing (e.g., CMP) of the semiconductor device.

Crosslinking the orthosilicate derived oligomers and use thereof is described herein by way of example in connection with formation of the SOD and PMD materials. However, such crosslinked orthosilicate derived oligomers are intended for use in semiconductor devices wherever appropriate to increase mechanical strength and/or reduce porosity, among the other benefits described herein.

Figure 3:
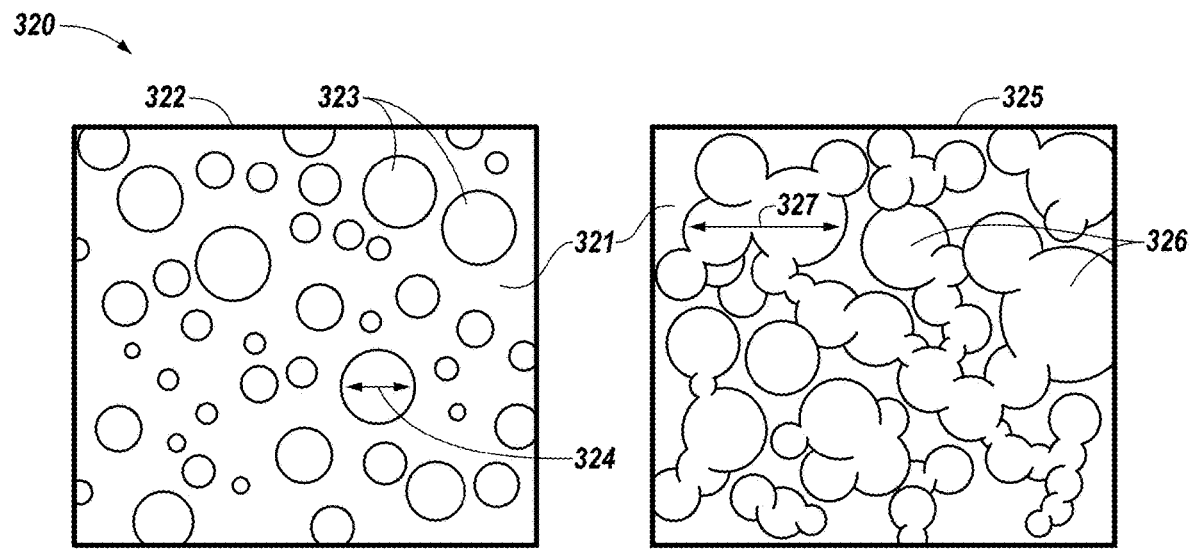
FIG. 3 illustrates porosity in a surface of a structural material of a semiconductor device as a defectivity to be overcome in accordance with a number of embodiments.

FIG. 3 illustrates porosity in a surface of a structural material of a semiconductor device as a defectivity 320 to be overcome in accordance with a number of embodiments. Structural materials used in formation of a semiconductor device may have various levels of porosity that are inherent and/or that are acquired during processing. Acquired porosity may, for example, result from deposition (e.g., spinning on) of orthosilicate derived oligomers into a trench having a high height to width aspect ratio, among other such causes during processing. Porosity as a defectivity 320 is intended herein to mean an unintended cavity that penetrates through a surface (e.g., as shown at 108 in FIG. 1) of a structural material and that extends to a depth (e.g., as shown at 109 in FIG. 1) in the structural material. The cavity may be surrounded by a wall of the structural material to the depth of the porosity. Such defectivity 320 may, for example, be porosity in the plurality of separate (e.g., amorphous) orthosilicate derived oligomers 106 shown and described in connection with FIG. 1.

Increasing levels of such defectivity 320 may result in the corresponding porosity levels increasingly weakening the mechanical strength of the structural material and/or enabling increased penetration of unintended gases and/or solid contaminants into and through the structural material (e.g., which may affect functionality and/or operable lifespan of the associated semiconductor device), among other potential unintended effects. Crosslinking of the orthosilicate derived oligomers in the structural material described herein provides a technique for at least partially overcoming the defectivity 320 resulting from the porosity.

Structural materials (e.g., organic SOD materials) may have a level of such a defectivity 320 that correlates with a varying C content in different types of the organic SOD material. Different types of silsesquioxane based oligomers may be used as organic SOD materials where the level of C content may be affected (e.g., determined) by varying composition of a number of R groups and a level of porosity of the spun-on (e.g., amorphous) silsesquioxane based oligomers may correlate with the level of C content. For example, the types of silsesquioxane based organic oligomers used for SOD materials may include a first type of SOD having an approximate 10-15% C content by weight, a second type of SOD having an approximate 20-35% C content by weight, and a third type of SOD having an approximate 40-60% C content by weight, among other possible types. The level of porosity of these types of SOD materials correspondingly increases with the C content such that the third type of SOD may have a percent porosity of around 20% (e.g., as determined by a combination of a surface area and a volume to the depth of the cavities in the third type of SOD material contributing to the defectivity 320).

For example, the left-hand image in FIG. 3 may represent a portion of a surface region 321 of the first type 322 of silsesquioxane based organic oligomer and the right-hand image may represent a portion of a surface region 321 of the third type 325 of silsesquioxane based organic oligomer prior to crosslinking the amorphous organic oligomers. The defectivity 320 of the first type 322 having the lower C content may be less than the defectivity 320 of the second type 325 based at least in part on a fewer number of pores 323 per surface area and/or a decreased average diameter 324 of the pores relative to the second type 325. The defectivity 320 of the second type 325 having the higher C content may be greater than the defectivity 320 of the first type 322 based at least in part on a greater number of pores 326 per surface area and/or an increased average diameter 327 of the pores, along with potential overlap of some of the pores, relative to the first type 322.

Orthosilicate derived oligomers (e.g., silsesquioxane based organic oligomers) of a structural material may be formed over (e.g., on) a surface of the semiconductor device. After forming (e.g., depositing, spinning on, etc.) the orthosilicate derived oligomers on the surface, a defectivity 320 may be at least partially overcome (e.g., notably reduced or eliminated) by exposing the structural material to an element from group 13, in a gaseous state, to reduce the porosity of a surface region 321 (e.g., corresponding to the percent porosity) of the structural material by crosslinking the O atoms each chemically bonded to one (e.g., only one) of a corresponding number of Si atoms in a pore 323, 326 through the surface region 321.

Accordingly, crosslinking the O atoms as described herein may contribute to (e.g., result in) reducing a diameter 324, 327 and/or a depth 109 of (e.g., substantially plugging) the pores 323, 326 in the structural material by 3D crosslinking the chains. Substantially plugging the pores 323, 326 may provide a number of benefits. Examples of such benefits include reducing a potential input of contaminant material (e.g., in gaseous, liquid, and/or solid form) through the pores into the structural material and/or into associated components of the semiconductor device and reducing a potential output through the pores of the structural material and/or materials from associated components of the semiconductor device. Substantially plugging the pores 323, 326 may contribute to (e.g., result in) extending a usable time (e.g., functionality and/or operable lifespan) of the semiconductor device by reduction of the potential input and/or output of unintended materials through the pores.

Figure 4:
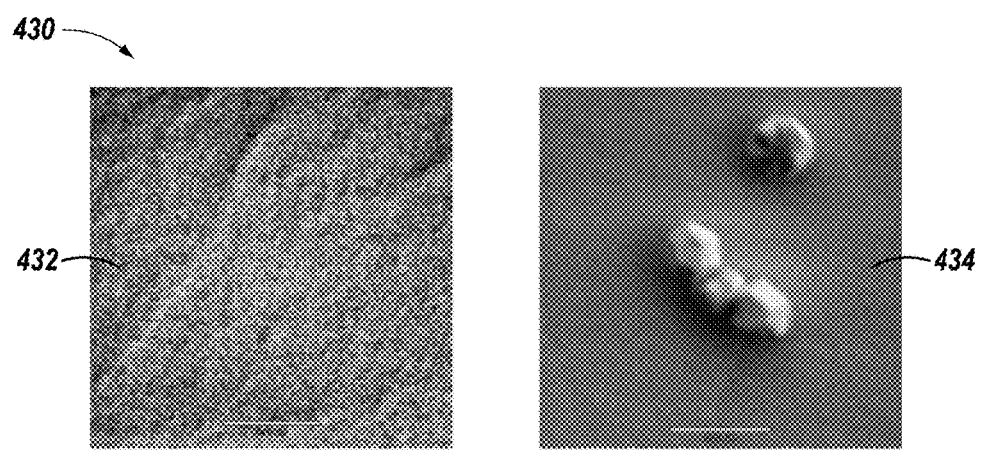
FIG. 4 illustrates scratching of a surface of a structural material of a semiconductor device due to slurry particle or residue and deposition on the surface as defectivities to be overcome in accordance with a number of embodiments.

FIG. 4 illustrates scratching of a surface of a structural material of a semiconductor device to slurry particle or residue and deposition on the surface as defectivities 430 to be overcome in accordance with a number of embodiments. Further processing may be performed on the orthosilicate derived oligomers of the structural material (e.g., after deposition of a plurality of separate orthosilicate derived oligomers 106 for the structural material 105 shown and described in connection with FIG. 1). Such processing may include, for example, removal of at least a portion of the orthosilicate derived oligomers from a surface (e.g., as shown at 107 and 108 in FIG. 1) of the structural material and/or removal of another material (not shown) formed over (e.g., on) the surface of the structural material. Removal of such materials may be accomplished by performance of various CMP and/or etching techniques, among other suitable techniques.

However, removal of such materials by performance of these techniques may result in (e.g., cause) various defectivities 430 on and/or into the surface of the structural material. The defectivities 430 resulting from the removal may include, for example, scratching of the surface of the structural material, as shown in the left-hand scanning electron microscopy (SEM) image at 432 and/or deposition of slurry residue having particles that may become embedded on or in the surface, as shown in the right-hand SEM image at 434. Another potential defectivity is that a portion (not shown) of the surface and underlying structural material, larger than a scratch, may be unintentionally removed (e.g., due to adhesive and/or cohesive weakness of the deposited amorphous orthosilicate derived oligomers), among other possible defectivities that may result from removal of such materials.

The scratching resulting in unintended formation of shallow trenches in the surface and/or unintended removal of a larger portion of the surface and the underlying structural material may result in (e.g., cause) unintended effects similar those related to the porosity described in connection with FIG. 3, among other possible unintended effects. Slurry residue particles extending from a surface of the structural material may result in (e.g., cause) unintended effects on the functionality and/or operable lifespan of the semiconductor device (e.g., resulting from an electrical failure (short circuit) of SOD and/or PMD materials, among other possible unintended effects). Crosslinking of the orthosilicate derived oligomers in the structural material described herein provides a technique for at least partially overcoming the defectivities 430 resulting from removal of the structural material by the increased mechanical strength enabling increased resistance to unintended removal of the structural material. The increased resistance to the unintended removal may result in reduction in an amount of slurry residue and/or particles that may cause defectivities (e.g., by being deposited) on the structural material.

Accordingly, after the structural material is formed over (e.g., on) a surface of the semiconductor device, the structural material may be exposed to an element from group 13 in a gaseous state. A portion of the structural material may be subsequently removed from the semiconductor device. A potential for a defectivity 430 on or in a surface of a remaining structural material may be reduced due to the increased mechanical strength of the structural material during removal of the portion of the structural material (e.g., by increased hardness resisting unintended removal and/or reducing resultant unintended deposition of the structural material).

In a number of embodiments, a portion of the structural material may be removed from the semiconductor device and the remaining structural material may be subsequently exposed to an element from group 13 in a gaseous state. The O atoms chemically bonded to one of the corresponding number of Si atoms that are exposed as a result of removal of the portion of the structural material may then be crosslinked in order to reduce a defectivity of a surface region of the remaining structural material that results from removal of the portion of the structural material. For example, O atoms coupled to Si atoms at ends of a plurality of orthosilicate derived oligomers that become exposed by unintended scratching and/or removal of the portion of the structural material may subsequently be 3D crosslinked to at least partially overcome (e.g., fill) the defectivity.

FIG. 5 is a flow diagram of an example method 550 for fabricating a semiconductor structure in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 551, the method 550 may include exposing a structural material for a semiconductor device to an element from group 13 of a periodic table of elements, where the structural material comprises an orthosilicate derived oligomer having a number of O atoms each chemically bonded to one of a corresponding number of Si atoms (e.g., as described with regard to the structural features and fabrication sequence in connection with FIGS. 1 and 2). At block 552, the method 550 may include forming a chemical bond between the element and the number of O atoms of the orthosilicate derived oligomer as a result of movement of the element through a surface of the structural material (e.g., as also described with regard to the structural features and fabrication sequence in connection with FIGS. 1 and 2). At block 553, the method 550 may include crosslinking chains of the orthosilicate derived oligomer to a depth of the movement below the surface (e.g., as also described with regard to the structural features and fabrication sequence in connection with FIGS. 1 and 2). At block 555, the method 550 may include increasing mechanical strength of the structural material to the depth of the crosslinking relative to the structural material formed without the crosslinking (e.g., as also described with regard to the structural features and fabrication sequence in connection with FIGS. 1 and 2).

The method 550 may, in a number of embodiments, further include increasing the mechanical strength by converting a plurality of the orthosilicate derived oligomers from an amorphous structural material to a semi-crystalline structural material. Formation of covalent chemical bonds that result from exposure of (e.g., in selected conditions in a chamber 662 of a processing apparatus 661 illustrated and described in connection with FIG. 6) the plurality of the orthosilicate derived oligomers to the element from group 13 results in (e.g., causes) the semi-crystalline state of the plurality of orthosilicate derived oligomers. The selected conditions may, in a number of embodiments, include performing exposure of the structural material to the element and formation of the chemical bond between the element and the number of O atoms at a temperature in a range of from around 40° C. to around 280° C. in order to fit within a thermal tolerance of the semiconductor device. Temperatures within that range are notably lower than temperatures used in treatment with various thermal, photochemical, and plasma techniques, which may not fit within the thermal tolerance.

The method 550 may, in a number of embodiments, further include forming the structural material over a surface of the semiconductor device and exposing the structural material to the element in a gaseous state (e.g., as described with regard to the structural features and fabrication sequence in connection with FIGS. 1 and 2). The mechanical strength of the structural material may thereby be increased by the chemical bond crosslink from an as-formed (e.g., by spin on deposition) range of from around 4 GPa to around 9 GPa, based on a Young's modulus, to an after-crosslinked range of from 30 to 60 GPa such that the mechanical strength is increased at least five-fold.

The method 550 may, in a number of embodiments, further include moving a number of atoms of the element through the surface of the structural material and scavenging $H_2O$ molecules and/or halide contaminants (e.g., fluorine (F), chlorine (Cl), etc., ions and/or molecules) using the number of atoms of the element during processing of the semiconductor device. Such scavenging may reduce (e.g., prevent) exposure of components of the semiconductor device to $H_2O$ and/or halides in order to reduce a probability of unintended effects on the semiconductor device.

The semiconductor device (e.g., a memory system 772 as shown and described in connection with FIG. 7) may be formed using the method of claim 13. In various embodiments, a portion of the semiconductor device may include a first memory device that includes at least one volatile memory cell or a second memory device that includes at least one non-volatile memory cell (e.g., memory cells in memory devices 776-1 and 776-N as shown and described in connection with FIG. 7).

Figure 6:
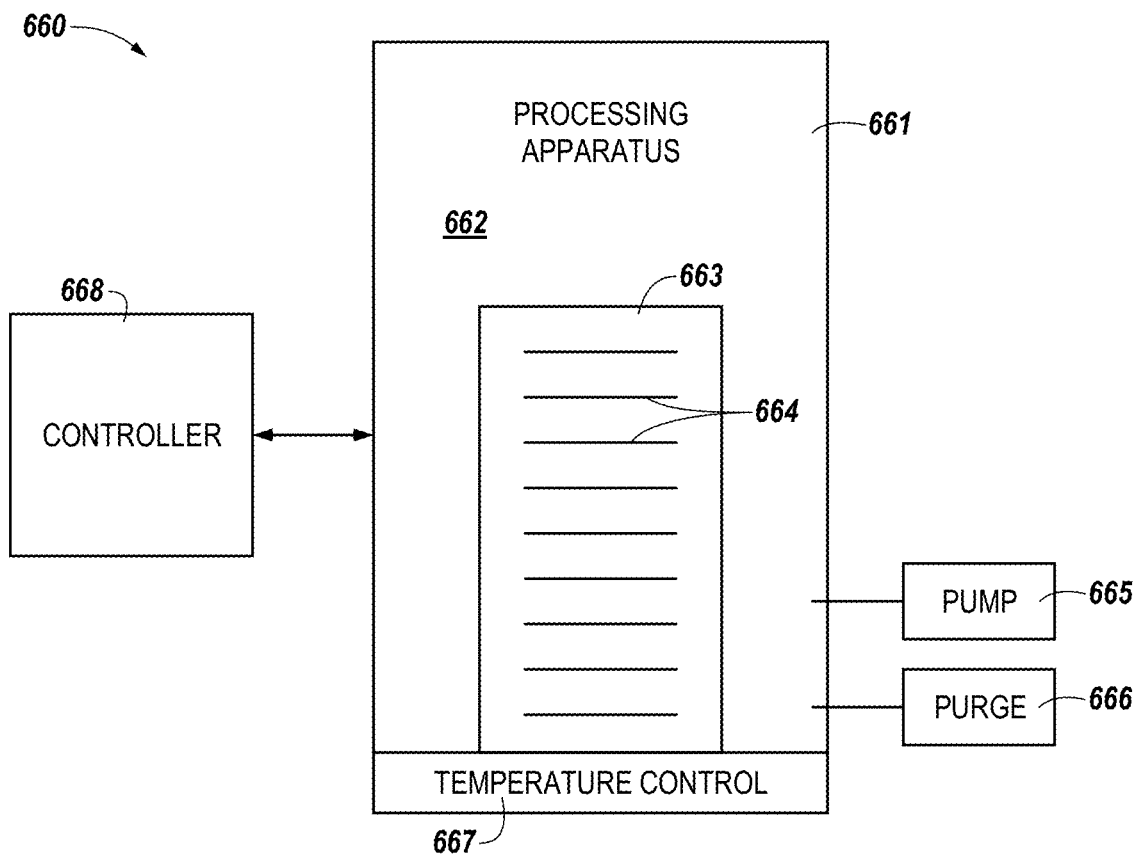
FIG. 6 is a functional block diagram of a system for implementation of an example semiconductor fabrication process in accordance with a number of embodiments of the present disclosure.

FIG. 6 is a functional block diagram of a system 660 for implementation of an example semiconductor fabrication process in accordance with a number of embodiments of the present disclosure. FIG. 6 illustrates an example processing apparatus 661 that may be used in a semiconductor fabrication process (e.g., the fabrication sequences 100 and 210 shown and described in connection with FIGS. 1 and 2).

Figure 7:
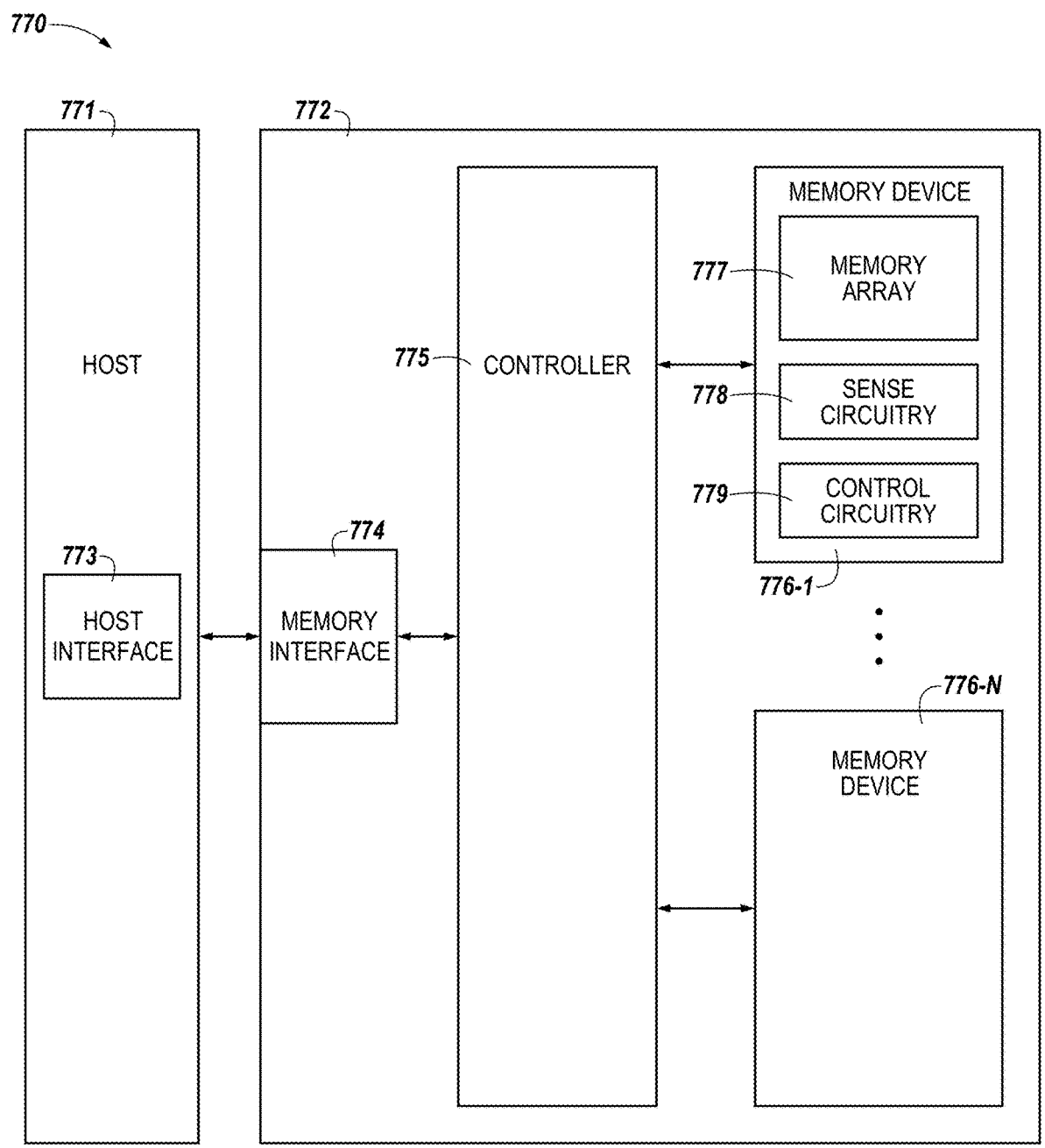
FIG. 7 is a functional block diagram of a computing system including at least one memory system in accordance with one or more embodiments of the present disclosure.

The processing apparatus 661 may include a chamber 662 to enclose components configured to perform formation (e.g., deposition), gas exposure (e.g., to a compound including an element selected from group 13), and/or removal (e.g., CMP and/or etch) operations on a number of semiconductor devices (e.g., wafers on which memory devices 776 or arrays 777 shown in FIG. 7 are being formed). The chamber 662 may further enclose a carrier 663 to hold, in a number of embodiments, either a single semiconductor wafer 664 or a batch of semiconductor wafers 664. The processing apparatus 661 may include and/or be associated with tools including, for example, a pump 665 unit and a purge 666 unit configured to enable movement of materials into and out of a chamber for processing a semiconductor device by introducing and removing appropriate chemistries, as described herein, at each point in the semiconductor fabrication sequence. The processing apparatus 661 may further include a temperature control 667 unit configured to maintain the chamber 662 at an appropriate temperature at each of the points in the fabrication sequence. The system 660 may include a number of chambers 662 that are each configured to perform particular processes (e.g., exposure to particular atoms, molecules, and/or compounds) in a gaseous state, wet and/or dry etch processes, and/or a deposition processes (e.g., spin on deposition), among others, during the fabrication sequence.

The system 660 may further include a controller 668. The controller 668 may include, or be associated with, circuitry and/or programming for implementation of, for instance, instructions received from a host (e.g., as shown at 771 and described in connection with FIG. 7) and, based on the instructions, direct the processing apparatus 661 to perform corresponding operations. Although an example of a host is shown at 771, embodiments are not limited to being coupled to the memory system 772 shown in FIG. 7. The instructions may be sent via a host interface 773 to the controller 668 of the processing apparatus 661. The instructions may be based at least in part on scaled preferences (e.g., in numerically and/or structurally defined gradients) stored by the host 771, provided via input from another storage system (not shown), and/or provided via input from a user (e.g., a human operator), among other possibilities. The controller 668 may be configured to enable input of the instructions and scaled preferences to define the CDs of the fabrication of the semiconductor structure to be implemented by the processing apparatus 661.

The controller 668 may, in a number of embodiments, be configured to use hardware as control circuitry. Such control circuitry may, for example, be an application specific integrated circuit (ASIC) with logic to control fabrication processes, sequences, and/or methods. For example, the controller 668 may be configured to receive the instructions and direct operations to perform semiconductor structure fabrication processes, sequences, and/or methods as described in connection with FIGS. 1-5.

Accordingly, the controller 668 may direct the processing apparatus 661 to tunably perform a number of operations. Tunability of the operations may, in a number of embodiments, be based on input of particular scaled preferences (e.g., exposure times, mass flow rates, concentrations, physical dimensions, etc.) and/or different options (e.g., for gaseous compounds containing atoms of various elements selected from group 13) stored by and received from the host. The particular scaled preferences and/or different options may be selectably input by a user (e.g., a human operator) through a user interface connected to the host.

The processing apparatus 661 may be directed to tunably expose a structural material (e.g., as shown at 105 and described in connection with FIG. 1 and elsewhere herein) of the semiconductor device 772 to an element in a gaseous state (e.g., as respectively shown at 218 and 214-2 and described in connection with FIG. 2 and elsewhere herein). The structural material may include a selectable orthosilicate derived oligomer (e.g., selection from inorganic and/or organic orthosilicate derived oligomers described herein) having a number of O atoms each chemically bonded to one (e.g., only one) of a corresponding number of Si atoms. The element is selectable from group 13 of a periodic table of elements.

The processing apparatus 661 also may be directed to tunably form chemical bonds (e.g., to a selected depth) between a number of atoms of the element that is selected and a corresponding number of the O atoms of the orthosilicate derived oligomer that is selected. The controller 668 may be further configured to implement the instructions to tunably control formation of the chemical bond of the selected element by the processing apparatus 661 at a selectable temperature in a range of from around 40° C. to around 280° C.

The chemical bonds may be formed in order to crosslink 219 chains 216 of the selected orthosilicate derived oligomer to a selectable depth (e.g., as shown at 109 and described in connection with FIG. 1 and elsewhere herein) of diffusion of the atoms of the selected element through a surface of, and into, the structural material. The processing apparatus 661 also may be directed to tunably increase the mechanical strength of the structural material to the depth selected for the diffusion relative to the structural material formed without exposure to the selectable element.

The controller 668 may be further configured to implement the instructions to tunably control formation of the chemical bond for the selected element to the selected depth. In a number of embodiments, formation of the chemical bond to the selected depth may be based on a combination in a single chamber 662 of a selectable time of exposure to the selected element and a selectable mass flow rate (e.g., standard cubic centimeters per minute (sccm)) for the selected element in the gaseous state. Alternatively, formation of the chemical bond to the selected depth may be based on a combination of a selectable number of cycles of movement of the selected element in the gaseous state into and out of a number of chambers 662 of the processing apparatus 661 and a selectable mass flow rate for the selected element in the number of chambers. For example, to enable diffusion of the atoms of the selected element through the surface of, and into, the structural material to the selected depth, more than one cycle of movement of the selected element in the gaseous state into and out of the single chamber 662 may be performed or the structural material may be sequentially moved into a plurality of chambers 662 in each of which a single cycle of movement of the selected element in the gaseous state into and out of a single chamber 662 may be performed, among other possibilities for exposure to the selected element.

The controller 668 may be further configured to implement the instructions to use B as the selected element. The B may be derived from $B_2H_6$ in the gaseous state converted by exposure to $H_2O$ into molecules of $B(OH)_3$ that are enabled to form the chemical bond. The gaseous $B_2H_6$ may be accessible from a source based on the instructions and the controller 668 may direct that an appropriate volume, concentration, and/or exposure time of $B_2H_6$ be input to and/or removed from the chamber 662. As such, a mass flow rate for movement of the $B_2H_6$ into the chamber for conversion into intermediate reaction product molecules of $B(OH)_3$ may be selectably tuned in order to enable the selected depth of diffusion and resultant crosslinking of at least two chains of the selected orthosilicate derived oligomer by a chemical bond with a B atom.

The controller 668 may be further configured to implement the instructions to selectably use a silsesquioxane based organic oligomer as the orthosilicate derived oligomer. The silsesquioxane based organic oligomer may be selected to have the Si atoms bonded to a particular mixture of alkyl, aryl, and/or alkoxy groups in addition to the O atoms in order to yield an intended weight percentage of C in the silsesquioxane based organic oligomer for use as a spin on dielectric (SOD).

The host 771 may be configured to generate the instructions related to movement of the materials into and out of the chamber 662 for formation of the semiconductor device. The interface 773 may be coupled to the host 771 and may be configured to enable input of the instructions to be implemented by the controller 668 of the processing apparatus 661 based at least in part on performance of the last three elements recited in independent claim 23 of the present disclosure. The instructions may be based at least in part on scaled preferences, to define critical dimensions of the semiconductor device, that determine final physical and chemical structures of at least one of trench isolation regions between conductive materials, SODs, and PMD barrier materials.

FIG. 7 is a functional block diagram of a computing system 770 including at least one memory system 772 (e.g., semiconductor device) in accordance with one or more embodiments of the present disclosure. Memory system 772 may be, for example, a solid-state drive (SSD).

In the embodiment illustrated in FIG. 7, memory system 772 includes a memory interface 774, a number of memory devices 776-1, . . . , 776-N, and a controller 775 selectably coupled to the memory interface 774 and memory devices 776-1, . . . , 776-N. Memory interface 774 may be used to communicate information between memory system 772 and another device, such as a host 771. Host 771 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, personal digital assistants (PDAs), memory card readers, interface hubs, and the like. Such a host 771 may be associated with fabrication operations performed on semiconductor devices and/or SSDs using, for example, a processing apparatus shown at 661 and described in connection with FIG. 6.

In a number of embodiments, host 771 may be associated with (e.g., include or be coupled to) a host interface 773. The host interface 773 may enable input of scaled preferences (e.g., in numerically and/or structurally defined gradients) to define, for example, critical dimensions (CDs) of a final structure or intermediary structures of a memory device (e.g., as shown at 776) and/or an array of memory cells (e.g., as shown at 777) formed thereon to be implemented by the processing apparatus 661 shown and described in connection with FIG. 6. The scaled preferences may be provided to the host interface 773 via input of a number of preferences stored by the host 771, input of preferences from another storage system (not shown), and/or input of preferences by a user (e.g., a human operator).

Memory interface 774 may be in the form of a standardized physical interface. For example, when memory system 772 is used for information (e.g., data) storage in computing system 770, memory interface 774 may be a serial advanced technology attachment (SATA) interface, a peripheral component interconnect express (PCIe) interface, or a universal serial bus (USB) interface, among other physical connectors and/or interfaces. In general, however, memory interface 774 may provide an interface for passing control, address, information, scaled preferences, and/or other signals between the controller 775 of memory system 772 and a host 771 (e.g., via host interface 773).

Controller 775 may include, for example, firmware and/or control circuitry (e.g., hardware). Controller 775 may be operably coupled to and/or included on the same physical device (e.g., a die) as one or more of the memory devices 776-1, . . . , 776-N. For example, controller 775 may be, or may include, an ASIC as hardware operably coupled to circuitry (e.g., a printed circuit board) including memory interface 774 and memory devices 776-1, . . . , 776-N. Alternatively, controller 775 may be included on a separate physical device that is communicatively coupled to the physical device (e.g., the die) that includes one or more of the memory devices 776-1, . . . , 776-N.

Controller 775 may communicate with memory devices 776-1, . . . , 776-N to direct operations to sense (e.g., read), program (e.g., write), and/or erase information, among other functions and/or operations for management of memory cells. Controller 775 may have circuitry that may include a number of integrated circuits and/or discrete components. In a number of embodiments, the circuitry in controller 775 may include control circuitry for controlling access across memory devices 776-1, . . . , 776-N and/or circuitry for providing a translation layer between host 771 and memory system 772.

Memory devices 776-1, . . . , 776-N may include, for example, a number of memory arrays 777 (e.g., arrays of volatile and/or non-volatile memory cells). For instance, memory devices 776-1, . . . , 776-N may include arrays of memory cells, such as a portion of an example memory device structured to include sense line contacts. At least one array includes a transistor having a gate structure formed according to the embodiments disclosed herein. As will be appreciated, the memory cells in the memory arrays 777 of memory devices 776-1, . . . , 776-N may be in a RAM architecture (e.g., DRAM, SRAM, SDRAM, FeRAM, MRAM, ReRAM, etc.), a flash architecture (e.g., NAND, NOR, etc.), a 3D RAM and/or flash memory cell architecture, or some other memory array architecture including pillars and adjacent trenches.

Memory device 776 may be formed on the same die. A memory device (e.g., memory device 776-1) may include one or more arrays 777 of memory cells formed on the die. A memory device may include sense circuitry 778 and control circuitry 779 associated with one or more arrays 777 formed on the die, or portions thereof. The sense circuitry 778 may be utilized to determine (sense) a particular data value (e.g., 0 or 1) that is stored at a particular memory cell in a row of an array 777. The control circuitry 779 may be utilized to direct the sense circuitry 778 to sense particular data values, in addition to directing storage, erasure, etc., of data values in response to a command from host 771 and/or host interface 773. The command may be sent directly to the control circuitry 779 via the memory interface 774 or to the control circuitry 779 via the controller 775.

The embodiment illustrated in FIG. 7 may include additional circuitry that is not illustrated so as not to obscure embodiments of the present disclosure. For example, memory device 776 may include address circuitry to latch address signals provided over I/O connectors through I/O circuitry. Address signals may be received and decoded by a row decoder and a column decoder to access a memory array 777. It will be appreciated that the number of address input connectors may depend on the density and/or architecture of memory devices 776 and/or memory arrays 777.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of R groups may refer to one or more R groups), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, substrate materials, structural materials, orthosilicate derived oligomers, dielectric materials, etch techniques, CMP techniques, deposition techniques (e.g., spin on deposition techniques, among others), techniques for forming, storage, accessing, and/or usage of compounds including an element selected from group 13, techniques for exposure to, diffusion of, and removal of materials in a gaseous state, techniques for control and determination of depth of diffusion of materials in a gaseous state and/or resultant crosslinking in orthosilicate derived oligomers, techniques for determination of mechanical strength of a structural material, techniques for determination of levels of porosity and defectivities of a structural material, memory devices, memory cells, and trenches, among other materials and/or components related to semiconductor structure formation, have been illustrated and described herein, embodiments of the present disclosure are not limited to those combinations explicitly recited herein. Other combinations and configurations of the semiconductor materials, substrate materials, structural materials, orthosilicate derived oligomers, dielectric materials, etch techniques, CMP techniques, deposition techniques, techniques for forming, storage, accessing, and/or usage of compounds including an element selected from group 13, techniques for exposure to, diffusion of, and removal of materials in a gaseous state, techniques for control and determination of depth of diffusion of materials in a gaseous state and/or resultant crosslinking in orthosilicate derived oligomers, techniques for determination of mechanical strength of a structural material, techniques for determination of levels of porosity and defectivities of a structural material, memory devices, memory cells, and trenches related to semiconductor structure formation than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. For example, proportions of the elements illustrated in FIGS. 1-5 are shown for clarity and may not be to scale. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a structural material for a semiconductor device, comprising:
   an orthosilicate derived oligomer having a number of oxygen (O) atoms each chemically bonded to one of a corresponding number of silicon (Si) atoms; and
   a chemical bond formed between an element from group 13 of a periodic table of elements and the number of O atoms of the orthosilicate derived oligomer;
   wherein the chemical bond crosslinks chains of the orthosilicate derived oligomer to increase mechanical strength of the structural material relative to the structural material formed without the chemical bond to crosslink the chains.

2. The apparatus of claim 1, wherein the element from group 13 is a single atom of the element.

3. The apparatus of claim 1, wherein the orthosilicate derived oligomer is an inorganic oligomer having the Si atoms bonded to atoms of hydrogen (H) and/or a metal in addition to the O atoms.

4. The apparatus of claim 1, wherein the orthosilicate derived oligomer is an organic oligomer having the Si atoms bonded to atoms of carbon (C) in addition to the O atoms.

5. The apparatus of claim 1, wherein the orthosilicate derived oligomer is a silsesquioxane based organic oligomer having the Si atoms bonded to alkyl, aryl, and/or alkoxy groups in addition to the O atoms.

6. The apparatus of claim 1, wherein the orthosilicate derived oligomer is a spin on dielectric (SOD) material for use in either a trench isolation region between conductive materials of the semiconductor device or in a trench between memory arrays.

7. The apparatus of claim 1, wherein the orthosilicate derived oligomer is a spin on dielectric (SOD) material that has a low dielectric constant (k) relative to silicon dioxide ($SiO_2$).

8. The apparatus of claim 1, wherein:
   the orthosilicate derived oligomer is a pre-metal dielectric (PMD) material for use in association with a Si containing substrate;
   the chemical bond crosslinks chains of the PMD material to reduce porosity of a surface of the PMD material; and
   the reduced porosity enhances formation of a PMD material barrier that isolates the Si containing substrate from a metal contaminant during processing of the semiconductor device.

9. The apparatus of claim 1, wherein the chemical bond formed between the element and the number of the plurality of O atoms is a covalent bond formed by substitution of the element for a hydrogen (H) atom from a hydroxyl (—OH) group of each of two chains of the orthosilicate derived oligomer.

10. The apparatus of claim 1, wherein:
    the orthosilicate derived oligomer is formed using a silsesquioxane based organic oligomer for use as a spin on dielectric (SOD) material; and
    the chemical bond crosslink increases the mechanical strength of the structural material from a range of from 4 gigapascals (GPa) to 9 GPa, based on a Young's modulus, to a range of from 20 to 60 GPa such that the mechanical strength is increased at least five-fold.

11. The apparatus of claim 1, wherein the element from group 13 is boron (B) derived from a B hydroxide ($B(OH)_3$) that chemically crosslinks a hydroxyl (—OH) group of each of two chains of the orthosilicate derived oligomer.

12. The apparatus of claim 1, wherein the element from group 13 is selected from at least one of aluminum (Al), gallium (Ga), indium (In), and thallium (Tl) derived from a respective hydroxide that chemically crosslinks a hydroxyl (—OH) group of each of two chains of the orthosilicate derived oligomer.

13. A method, comprising:
    exposing a structural material for a semiconductor device to an element from group 13 of a periodic table of elements, wherein the structural material comprises an orthosilicate derived oligomer having a number of oxygen (O) atoms each chemically bonded to one of a corresponding number of silicon (Si) atoms;
    forming a chemical bond between the element and the number of O atoms of the orthosilicate derived oligomer as a result of movement of the element through a surface of the structural material;
    crosslinking chains of the orthosilicate derived oligomer to a depth of the movement below the surface; and
    increasing mechanical strength of the structural material to the depth of the crosslinking relative to the structural material formed without the crosslinking.

14. The method of claim 13, wherein increasing the mechanical strength comprises converting a plurality of the orthosilicate derived oligomers from an amorphous structural material to a semi-crystalline structural material using covalent chemical bonds that result from exposure to the element from group 13.

15. The method of claim 13, further comprising:
    forming the structural material over a surface of the semiconductor device;
    exposing the structural material to the element in a gaseous state;
    increasing the mechanical strength of the structural material by the chemical bond crosslink from an as-formed range of from 4 gigapascals (GPa) to 9 GPa, based on a Young's modulus, to an after-crosslinked range of from 30 to 60 GPa such that the mechanical strength is increased at least five-fold.

16. The method of claim 13, further comprising:
    forming the structural material over a surface of the semiconductor device;
    exposing the structural material to the element in a gaseous state;
    subsequently removing a portion of the structural material from the semiconductor device; and
    reducing a potential surface defectivity of a remaining structural material due to the increased mechanical strength of the structural material [resisting unintended removal and/or unintended resultant deposition] during removal of the portion of the structural material.

17. The method of claim 13, further comprising:
forming the structural material over a surface of the semiconductor device; and
exposing the structural material to the element in a gaseous state to reduce a porosity of a surface region of the structural material by crosslinking the O atoms chemically bonded to one of the corresponding number of Si atoms in a pore through the surface region.

18. The method of claim 17, further comprising:
reducing a diameter and a depth of (e.g., substantially plugging) the pore in the structural material by three-dimensionally crosslinking the chains;
reducing a potential input of contaminant material through the pore into the structural material and into associated components of the semiconductor device;
reducing a potential output through the pore of the structural material and materials from associated components of the semiconductor device; and
extending a usable time of the semiconductor device by reduction of the potential input and output of materials through the pore.

19. The method of claim 13, further comprising:
removing a portion of the structural material from the semiconductor device;
subsequently exposing remaining structural material to the element in a gaseous state; and
crosslinking the O atoms chemically bonded to one of the corresponding number of Si atoms that are exposed as a result of removal of the portion of the structural material in order to reduce a defectivity of a surface region of the remaining structural material that potentially results from removal of the portion of the structural material.

20. The method of claim 13, further comprising:
moving a number of atoms of the element through the surface of the structural material; and
scavenging water ($H_2O$) molecules and halide contaminants using the number of atoms of the element during processing of the semiconductor device in order to reduce a probability of unintended effects on the semiconductor device.

21. The method of claim 13, further comprising performing exposure of the structural material to the element and formation of the chemical bond between the element and the number of O atoms at a selectable temperature in a range of from 40 degrees Celsius (° C.) to 280° C. in order to fit within a thermal tolerance of the semiconductor device.

22. The semiconductor device formed by the method of claim 13, wherein a portion of the semiconductor device comprises a first memory device that includes at least one volatile memory cell or a second memory device that includes at least one non-volatile memory cell.

23. A system, comprising:
a processing apparatus configured to enable movement of materials into and out of a chamber for processing a semiconductor device; and
a controller configured to receive instructions from a host and, based on the instructions, direct the processing apparatus to:
tunably expose a structural material of the semiconductor device to an element in a gaseous state, wherein the structural material comprises a selectable orthosilicate derived oligomer having a number of oxygen (O) atoms each chemically bonded to one of a corresponding number of silicon (Si) atoms and wherein the element is selectable from group 13 of a periodic table of elements;
tunably form chemical bonds between a number of atoms of the element that is selected and a corresponding number of the O atoms of the orthosilicate derived oligomer that is selected in order to crosslink chains of the selected orthosilicate derived oligomer to a selectable depth of diffusion of the atoms of the selected element through a surface of, and into, the structural material; and
tunably increase mechanical strength of the structural material to a depth selected for the diffusion relative to the structural material formed without exposure to the selectable element.

24. The system of claim 23, wherein the controller is further configured to implement the instructions to tunably control formation of the chemical bond of the selected element at a selectable temperature in a range of from 40 degrees Celsius (° C.) to 280° C.

25. The system of claim 23, wherein:
the controller is further configured to implement the instructions to tunably control formation of the chemical bond for the selected element to the selected depth;
wherein formation of the chemical bond to the selected depth is based on a combination in the chamber of a selectable time of exposure to the selected element and a selectable mass flow rate for the selected element in the gaseous state.

26. The system of claim 23, wherein:
the controller is further configured to implement the instructions to tunably control formation of the chemical bond for the selected element to the selected depth;
wherein formation of the chemical bond to the selected depth is based on a combination of a selectable number of cycles of movement of the selected element in the gaseous state into and out of a number of chambers of the processing apparatus and a selectable mass flow rate for the selected element in the number of chambers.

27. The system of claim 23, wherein the controller is further configured to implement the instructions to:
use boron (B) as the selected element, wherein the B is derived from diborane ($B_2H_6$) in the gaseous state converted by exposure to water ($H_2O$) into molecules of boron hydroxide ($B(OH)_3$) that are enabled to form the chemical bond; and
selectably tune a mass flow rate for movement of the $B_2H_6$ into the chamber in order to enable the selected depth of diffusion and resultant crosslinking of two chains of the selected orthosilicate derived oligomer by a chemical bond with a B atom.

28. The system of claim 23, wherein the controller is further configured to implement the instructions to:
selectably use a silsesquioxane based organic oligomer as the orthosilicate derived oligomer;
wherein the silsesquioxane based organic oligomer is selected to have the Si atoms bonded to a particular mixture of alkyl, aryl, and/or alkoxy groups in addition to the O atoms in order to yield an intended weight percentage of carbon (C) in the silsesquioxane based organic oligomer for use as a spin on dielectric (SOD).

29. The system of claim 23, wherein the system further comprises:
the host configured to generate the instructions related to movement of the materials into and out of the chamber for formation of the semiconductor device; and an interface coupled to the host and configured to enable input of the instructions to be implemented by the processing apparatus based at least in part on performance of the last three elements recited in claim 23;

wherein the instructions are based at least in part on scaled preferences, to define critical dimensions of the semiconductor device, that determine final physical and chemical structures of at least one of trench isolation regions between conductive materials, spin on dielectrics (SOD), and pre-metal dielectric (PMD) barrier materials.

\* \* \* \* \*